(12) United States Patent
Pauletti

(10) Patent No.: US 7,224,202 B2
(45) Date of Patent: May 29, 2007

(54) SELF-BIASED HIGH VOLTAGE LEVEL SHIFTER

(75) Inventor: Timothy P. Pauletti, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 10 days.

(21) Appl. No.: 10/982,729

(22) Filed: Nov. 3, 2004

(65) Prior Publication Data

US 2006/0091929 A1    May 4, 2006

(51) Int. Cl.
*H03L 5/00* (2006.01)
(52) U.S. Cl. .......................... 327/333; 326/68; 326/81
(58) Field of Classification Search ............... 327/333, 327/314, 318, 319, 320, 325, 326; 326/68, 326/80, 81
See application file for complete search history.

(56) References Cited

U.S. PATENT DOCUMENTS

| 5,027,014 | A | * | 6/1991 | Bass et al. | ........................ | 326/66 |
| 5,896,043 | A | * | 4/1999 | Kumagai | ........................ | 326/68 |
| 6,864,718 | B2 | * | 3/2005 | Yu | ........................ | 327/333 |

* cited by examiner

*Primary Examiner*—Long Nguyen
(74) *Attorney, Agent, or Firm*—William B Kempler; W. James Brady; Frederick J. Telecky, Jr.

(57) ABSTRACT

A high voltage level shifter having a cost effective design that saves chip architecture and power. The high voltage level-shifter includes a resistor connected between a first node and a first power supply rail. An inverter couples to receive an input signal to provide an inverted input signal. A first circuit portion couples to receive the inverted input signal and connects between the first power supply rail and a second power supply rail for converting a high voltage signal into a low voltage signal. The first circuit portion includes a first clamp circuit, wherein the first circuit portion is biased through the first clamp circuit and the first node. A second circuit portion couples to receive the input signal and connects between the first power supply rail and a second power supply rail for converting a low voltage signal into a high voltage signal. The second circuit portion includes a second clamp circuit, wherein the second circuit portion is biased through the second clamp circuit and the first node. The second circuit portion provides a first internal bias for the first circuit portion and the first circuit portion provides a second internal bias for the second circuit portion. This high voltage level-shifter provides level shifting a low voltage signal (<5V) to a high voltage signal (~40V), with no static power dissipation while still protecting all devices.

23 Claims, 2 Drawing Sheets

SELF-BIASED HIGH VOLTAGE LEVEL SHIFTER

FIELD OF THE INVENTION

The present invention relates to level shifters and, more particularly, a self-biased high voltage level shifter.

BACKGROUND OF THE INVENTION

Many integrated circuits, such as display drivers, require a combination of high-voltage driving capability (an output voltage swing up to 100V or more) and a digital control using standard 5V CMOS logic. Hence, complex level-shifting circuits are needed to convert the 5V control signals into the desired high-voltage output waveforms. Moreover, in many of those applications, the system is battery-powered and very severe constraints are put on the power consumption of the level-shifters. One application where both high-voltage driving capability and low power consumption are required in the design of driver chips is in automotive applications.

Level shifters, in general, are utilized in a circuit to transition from a low voltage signal to a high voltage signal. In the alternative, a level shifter may be used to transition from a high voltage signal to a low voltage signal. Level shifters are commonly used for multi-rail or multi-power supply designs, where multiple rails or multiple power supplies exist and numerous signals reference these multiple rails or power supplies. These signals interact with various logic blocks that operate on different power supplies. Thus, every time a high voltage signal is transferred to a low voltage block, the signal must be level-shifted. Similarly, in the alternative, when a low-voltage signal is transferred to a high voltage block, the signal must be level-shifted.

Most of the circuits in the automotive electronic systems are high voltage circuits. High voltage level shifters, however, are large. In addition, when there are a lot of signals that need to be level-shifted, it becomes very difficult to incorporate large level shifters in a system's design. Thus, to date, there has been no way of designing around the affects of incorporating high voltage level shifters in a system. In particular, high-voltage signals in a electronic system leads to high-voltage components which are larger than low-voltage components. Secondly, another deficiency of high-voltage level-shifters is that they are slow. Primarily, because the high-voltage components are large, these components cannot be switched as fast as low-voltage components.

Referring to known a high-voltage level-shifter 10 as is displayed FIG. 1, a low-voltage input signal $IN_1$ is level-shifted to an high voltage output signal $Out_1$. Transistors, $MN_1$ and $MN_2$, provide the level shifting function to shift a voltage applied at the input signal node $IN_1$ to a signal at the output node $Out_1$. Transistors, $MP_1$ and $MP_2$, protect the drain-to-source voltage $V_{ds}$ and gate-to-source voltage $V_{gs}$ of transistors, $MP_4$ and $MP_3$. Diodes, $D_2$ and $D_1$, only provide protection for the gate-to-source voltage $V_{gs}$ of transistors, $MP_2$ and $MP_1$. A high voltage reference $HV_{ref1}$ is applied to gate of transistors, $MP_2$ and $MP_1$, such that the source of each transistor, $MP_2$ and $MP_1$, will not go one gate-to-source voltage $V_{gs}$ above the $HV_{ref1}$ signal. This design for a high voltage level-shifter is troublesome in that it requires a large and complex circuit to provide a high voltage reference $HV_{ref1}$.

FIG. 2 shows the another known level-shifter 20 that is self-biased, wherein a low-voltage input signal $IN_2$ is level shifted to an high voltage output signal $Out_2$. Transistors, $MN_3$ and $MN_4$, are switched on and off to provide the level-shifting feature of level-shifter 20. Transistors, $MP_6$ and $MP_5$, protect the drain-to-source voltage $V_{ds}$ and gate-to-source voltage $V_{gs}$ of transistors, $MP_8$ and $MP_7$. As shown, a current source $I_1$ is pulled through two reverse bias Zener diodes, $D_4$ and $D_3$, which have a 6.5V breakdown voltage for this particular technology. Those skilled in the art would recognize that even if a Zener diode has a 13V breakdown voltage, the only requirement is that the breakdown voltages of diodes, $D_4$ and $D_3$, must correspond with the $v_{gs}$ of transistors, $MP_5$ and $MP_6$. Diodes, $D_4$ and $D_3$, provide the high voltage reference signal which is applied to each gate of transistors, $MP_5$ and $MP_6$, such that the source of each transistor, $MP_5$ and $MP_6$, will not go one gate-to-source voltage $V_{gs}$ above the high voltage reference signal.

The difference between the design of high voltage level-shifter 20 and the design of the level-shifter 10 in FIG. 1 is the way in which the high voltage reference signal $HV_{ref1}$ is generated. This approach, however, requires the external current source $I_1$.

Thus, there exists a need for a self-biased high voltage level shifter that provides level shifting a low voltage signal (<5V) to a high voltage signal (~40V), with no static power dissipation while still protecting all devices. Furthermore, there exists a need for a simple, yet, cost-effective design that does not require an external current source.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of high voltage level shifters, the present invention teaches a high voltage level-shifter having a novel, simple design that provides level shifting a low voltage signal (<5V) to a high voltage signal (~40V), with no static power dissipation while still protecting all devices.

The high voltage level-shifter includes a resistor connected between a first node and a first power supply rail. An inverter couples to receive an input signal to provide an inverted input signal. A first circuit portion couples to receive the inverted input signal and connects between the first power supply rail and a second power supply rail for converting a high voltage signal into a low voltage signal. The first circuit portion includes a first clamp circuit, wherein the first circuit portion is biased through the first clamp circuit and the first node. A second circuit portion couples to receive the input signal and connects between the first power supply rail and a second power supply rail for converting a low voltage signal into a high voltage signal. The second circuit portion includes a second clamp circuit, wherein the second circuit portion is biased through the second clamp circuit and the first node. The second circuit portion provides a first internal bias for the first circuit portion and the first circuit portion provides a second internal bias for the second circuit portion.

The first circuit portion includes a first N-type transistor connected between a second node and a first power supply rail. The first N-type transistor is biased by the inverted input signal. A first P-type transistor connects between the second node and a fourth node. The first P-type transistor is biased by the first clamp circuit at the first node. A second P-type transistor connects between a second power supply rail and the fourth node which provides the output signal. The second P-type transistor is biased by the first internal bias provided by the second circuit portion.

The second circuit portion includes a first N-type transistor connected between a second node and a first power supply rail. The first N-type transistor is biased by the input signal. A first P-type transistor connects between the second node and a fourth node. The first P-type transistor is biased by the second clamp circuit at the first node. A second P-type transistor connects between a second power supply rail and the fourth node which provides the output signal. The second P-type transistor is biased by the second internal bias provided by the first circuit portion.

The first and second clamp circuits each may include a series connected pair of diodes, whereby the integrated bias current though each clamp circuit protects the first P-type transistor in each of the first and second circuit portions.

The advantages of this solution is that the implementation is smaller than previous solutions where there are fewer components tied to the power supply rail or battery. In addition, there is only static power dissipation when the voltage is above the clamp voltage.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
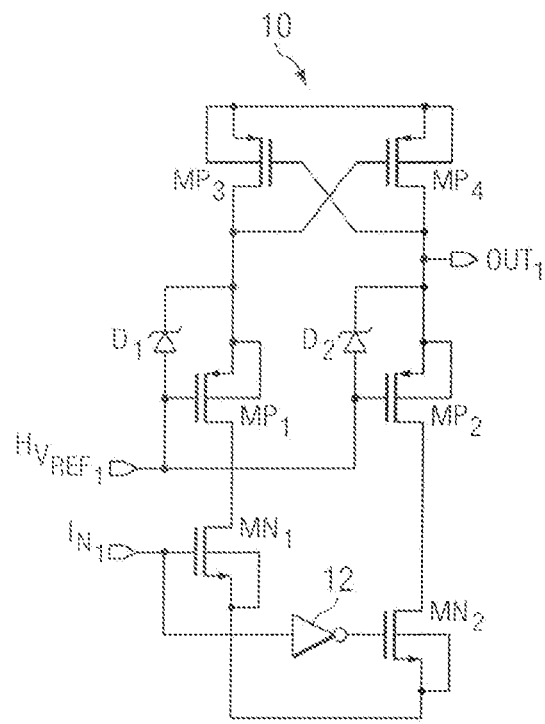
FIG. 1 is a known high voltage level-shifter.

One or more exemplary implementations of the present invention will now be described with reference to the attached drawings, wherein like reference numerals are used to refer to like elements throughout. The various aspects of the invention are illustrated below in a high voltage level shifter, although the invention and the appended claims are not limited to the illustrated examples.

The present invention is best understood by comparison with the prior art. Hence, this detailed description begins with a discussion of known high voltage level shifter as is shown in FIG. 1. As shown, a low-voltage input signal $IN_1$ is level-shifted to an high voltage output signal $Out_1$. Transistors $MN_2$ and $MN_1$ are switched on and off, wherein when transistor $MN_2$ is on, transistor $MN_1$ is off. The converse is also true. In the instance, where input signal $IN_1$ is a high signal, transistor $MN_1$ will turn on. Current will flow through the drain node of transistor $MN_1$ which pull down the gate of transistor $MP_4$. Since the gate of transistor $MP_4$ is pulled down, the gate-to-source voltage $V_{gs}$ of transistor $MP_4$ opens up and turns on transistor $MP_4$ very hard, pulling the signal $Out_1$ up. Thereby, when the signal $IN_1$ goes high, the signal $Out_1$ goes up. When signal $IN_1$ goes low, transistor $MN_2$ turns on, wherein current flows through transistors, $MP_2$ and $MP_3$. The purpose of transistors, $MP_2$ and $MP_1$, is to protect the drain-to-source voltage $V_{ds}$ and gate-to-source voltage $V_{gs}$ of transistors, $MP_4$ and $MP_3$. Diodes, $D_2$ and $D_1$, only provide protection for the gate-to-source voltage $V_{gs}$ of transistors, $MP_2$ and $MP_1$. A high voltage reference $HV_{ref1}$ is applied to gate of transistors, $MP_2$ and $MP_1$, such that the source of each transistor, $MP_2$ and $MP_1$, will not go one gate-to-source voltage $V_{gs}$ above the $HV_{ref1}$ signal. A large and complex circuit is conventional used to generate the high voltage reference $HV_{ref1}$.

Figure 2:
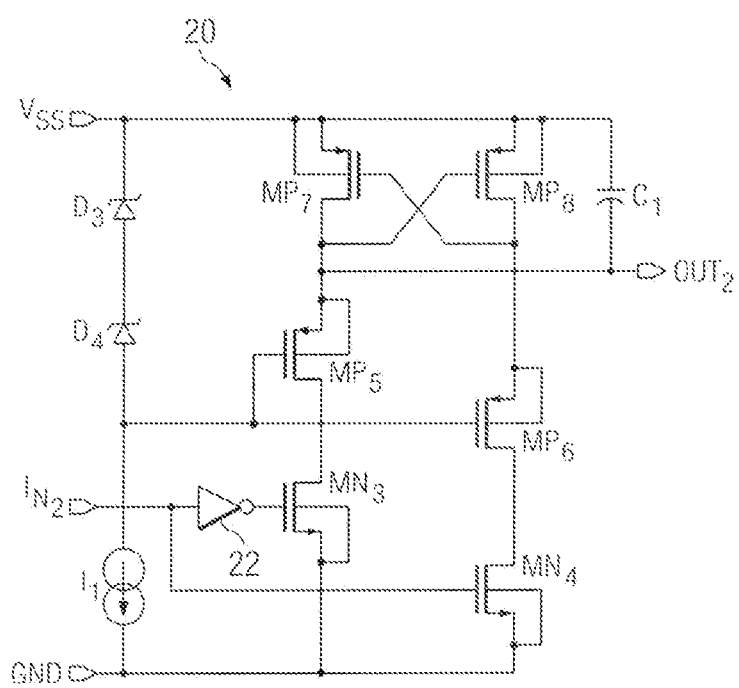
FIG. 2 illustrates a known self-biased high voltage level-shifter.

FIG. 2 shows the another known self-biased level shifter, wherein a low-voltage input signal $IN_2$ is level shifted to an high voltage output signal $Out_2$. Input signal $IN_2$ is inverted by inverter 22. Signal $IN_2$ and the inverted version of signal $IN_2$ couples to the gate of transistors, $MN_3$ and $MN_4$, respectively. Transistors, $MN_3$ and $MN_4$, are switched on and off, wherein when transistor $MN_3$ is on, transistor $MN_4$ is off. Accordingly, the converse is true. When input signal $IN_2$ is a high signal, transistor $MN_3$ turns on. Current flows through the drain of transistor $MN_3$ which pull down the gate of transistor $MP_8$. Since the gate of transistor $MP_8$ is pulled down, the gate-to-source voltage $V_{gs}$ of transistor $MP_8$ opens up and turns transistor $MP_8$ on fully, pulling the signal $Out_2$ up. Thereby, when the input signal $IN_2$ goes high, the signal $Out_2$ increases. When signal $IN_2$ is low, transistor $MN_4$ turns on, wherein current flows through transistors, $MP_6$ and $MP_7$. The purpose of transistors, $MP_6$ and $MP_5$, is to protect the drain-to-source voltage $V_{ds}$ and gate-to-source voltage $V_{gs}$ of transistors, $MP_8$ and $MP_7$. As shown a current source 11 is pulled through two reverse bias Zener diodes, $D_4$ and $D_3$, which have a 6.5V breakdown voltage for this particular technology. Those skilled in the art would recognize that even if a Zener diode has a 13V breakdown voltage, the only requirement is that the breakdown voltages of diodes, $D_4$ and $D_3$, must correspond with the $V_{gs}$ of transistors, $MP_6$ and $MP_5$. Diodes, $D_4$ and $D_3$, provide the high voltage reference signal which is applied to each gate of transistors, $MP_6$ and $MP_5$, such that the source of each transistor, $MP_6$ and $MP_5$, will not go one gate-to-source voltage $V_{gs}$ above the high voltage reference signal. The difference between this design and the design of the level-shifter in FIG. 1 is the way in which the high voltage reference signal $HV_{ref1}$ is generated. Optionally, a capacitor $C_1$ may AC couple the output $Out_2$ to ensure that there are no high voltage transients on the output signal $Out_2$ such that the output signal $Out_2$ is reflective of any changes in supply voltage $V_{SS}$. This approach, however, has static power dissipation. In addition, this approach requires an external current source $I_1$, wherein an ideal current source $I_1$ is utilized. In an actual application, however, no ideal current source exists, but rather current must be supplied external to the device. This requirement creates a substantial disadvantage for this design.

Figure 3:
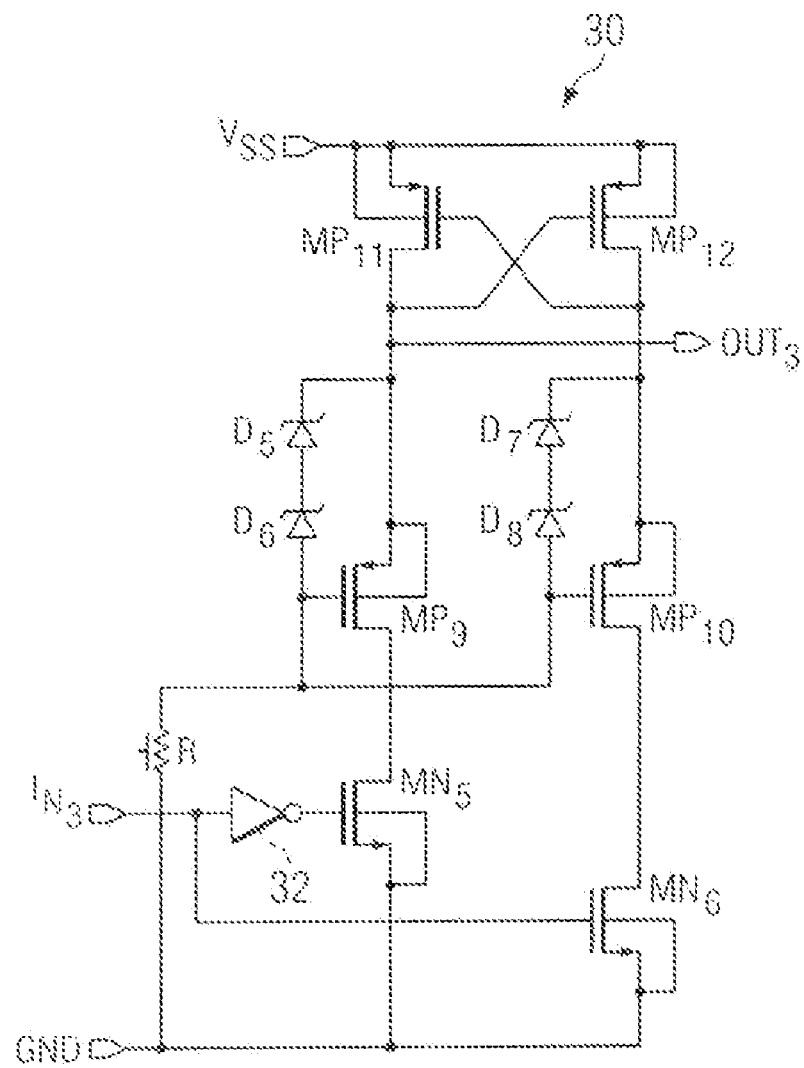
FIG. 3 displays a self-biased high voltage level-shifter in accordance with the present invention.

FIG. 3 illustrates a level shifting structure in accordance with the present invention. This high voltage level-shifter is self-biased and does not have the requirement of an external current source. This solution provides a novel circuit and method for setting up the high voltage reference. As opposed to FIGS. 1 and 2, this implementation does not need any external current reference nor a large amount of circuitry to set up a high voltage reference.

As shown, a low-voltage input signal IN3 is level shifted to an high voltage output signal Out3. Input signal IN3 is inverted by inverter 32. Signal IN3 and the inverted version of signal IN3 couples to the gate of transistors, MN5 and MN6, respectively. Transistors, MN5 and MN6, are switched on and off, wherein when transistor MN5 is on, transistor MN6 is off. Accordingly, the converse is true. As such, transistors, MN6 and MN5, perform the level-shifting function. The high voltage reference is set up on the gate of transistors, MP9 and MP10, through diodes, D5 and D6, or D7 and D8, respectively, which are reversed biased through the resistor R1. If input signal IN3 is high, transistor MN6 will turn on and pull the gate of transistor MP11 low which is connected to the drain of transistor MP12. Thereby transistor MP11 turns on and current flows through transistor MP11. This pulls the drain of transistor MP11 high. The drain of transistor MP11 will only increase as high as the Zener breakdown of diodes, D5 and D6, allow it to increase. Once the breakdown of the transistors that make up diodes, D5 and D6, are met, current begins to flow through diodes, D5 and D6, which is limited by resistor R1.

In the alternative, when input signal $IN_3$ is low, transistor $MN_{11}$ will turn on and pull the gate of transistor $MP_{12}$ low which is connected to the drain of transistor $MP_{11}$. Thereby, transistor $MP_{12}$ turns on and current flows through transistor $MP_{12}$. As a result, the drain of transistor $MP_{12}$ is pulled high. The drain of transistor $MP_{12}$, however, will only increase as high as the Zener breakdown of diodes, $D_7$ and $D_8$, allow it to increase. Once the breakdown of the transistors that make up diodes, $D_7$ and $D_8$, are met, current begins to flow through diodes, $D_7$ and $D_8$, which is limited by resistor $R_1$. Thereby, transistors, $MP_9$ and $MP_{10}$, will always be protected because transistors, $MN_5$ and $MN_6$, are always on and out of phase. This guarantees a high voltage reference at all times.

Specifically, the high voltage reference is set up using resistor $R_1$ connected to diodes, $D_5$ and $D_6$, or, in the alternative, diodes, $D_7$ and $D_8$. Particularly, as soon as the reverse breakdown of diodes, $D_5$ and $D_6$, is met, current flows through the diodes, $D_5$ and $D_6$, and through the resistor $R_1$ which sets up a voltage at the gate of transistor $MP_9$. This voltage is related to the reverse breakdown of the Zener diodes, $D_5$ and $D_6$. Therefore, as the voltage at the drain of transistor $MP_1$, increases, the breakdown of the two diodes, $D_5$ and $D_6$, is met. As a result, current begins to flow through diodes, $D_5$ and $D_6$, and the gate of transistor $MP_9$ begins to rise. For example, if the voltage at the drain of transistor $MP_{11}$, rises to 50V, the gate of transistor $MP_9$ would only be 13V below 50V. In the alternative, for example, if the voltage at the drain of transistor $MP_{11}$ decreases to another voltage, the gate of transistor $MP_9$ would only be 13V below the same voltage at the drain of transistor $MP_{11}$.

In the alternative, the high voltage reference is set up using resistor $R_1$ connected to diodes, $D_7$ and $D_8$. Specifically, as soon as the reverse breakdown of diodes, $D_7$ and $D_8$, is met, current flows through the diodes, $D_7$ and $D_8$, and through the resistor $R_1$ which sets up a voltage at the gate of transistor $MP_{10}$. This voltage is related to the reverse breakdown of the Zener diodes, $D_7$ and $D_8$. Therefore, as the voltage at the drain of transistor $MP_{12}$ increases, the breakdown of the two diodes, $D_7$ and $D_8$, is met, current begins to flow through the diodes, $D_7$ and $D_8$, and the gate of transistor $MP_{10}$ begins to rise. If the voltage at the drain of transistor $MP_{12}$, for example, rises to 50V, the gate of transistor $MP_{10}$ would only be 13V below 50V. If the voltage at the drain of transistor $MP_{12}$, for example, decreases to another voltage, the gate of transistor $MP_{10}$ would only be 13V below the same voltage at the drain of transistor $MP_{12}$.

Advantages of the high voltage level shifter in accordance with the present invention include, but are not limited to, a high voltage level-shifter having a cost effective design that chip architecture (or real estate) and power. The high voltage level-shifter in accordance with the present invention is smaller than previous solutions where there are fewer components tied to the power supply rail or battery. In addition, there is only static power dissipation when the voltage is above the clamp voltage.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims that follow.

Those of skill in the art will recognize that the physical location of the elements illustrated in FIG. 3 can be moved or relocated while retaining the function described above.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A high voltage level shifter, the high voltage level shifter coupled to receive a low-voltage input signal to generate a higher-voltage output signal, comprising:
    a resistor coupled between a first node and a first power supply rail;
    an inverter coupled to receive the input signal to generate an inverted input signal;
    a first circuit portion coupled between the first power supply rail and a second power supply rail for converting a low-voltage low-state signal into a higher-voltage low-state signal, the first circuit portion includes a first clamp circuit, wherein the first circuit portion is biased through the first clamp circuit and the first node, the first circuit portion coupled to receive the inverted input signal wherein the first circuit portion comprises:
    a first N-type transistor coupled between a second node and the first power supply rail, the first N-type transistor biased by the inverted input signal;
    a first P-type transistor coupled between the second node and a fourth node, the first P-type transistor biased by the first clamp circuit at the first node; and
    a second P-type transistor coupled between the second power supply rail and the fourth node, the second P-type transistor biased by a first internal bias wherein the fourth node supplies the output signal and wherein the first clamp circuit comprises a first diode and a second diode coupled in series between the first node and fourth node; and a second circuit portion coupled between the first power supply rail and the second power supply rail for converting a low-voltage high-state signal into a higher-voltage high-state signal, the second circuit portion includes a second clamp circuit, wherein the second circuit portion is biased through the second clamp circuit and the first node, the second circuit portion coupled to receive the input signal, wherein the second circuit portion provides the first internal bias for the first circuit portion and the first circuit portion provides a second internal bias for the second circuit portion.

2. The high voltage level shifter of claim 1, wherein the second circuit portion comprises:

a first N-type transistor coupled between a third node and the first power supply rail, the first N-type transistor biased by the input signal;

a first P-type transistor coupled between the third node and a fifth node, the first P-type transistor biased by the second clamp circuit at the first node; and a second P-type transistor coupled between the second power supply rail and the fifth node, the second P-type transistor biased by the second internal bias provided by the first circuit portion.

3. The high voltage level shifter of claim 2, wherein the second clamp circuit comprises a first diode and a second diode coupled in series between the first node and the fifth node.

4. The high voltage level shifter of claim 1, wherein the first N-type transistor of the first circuit portion includes a backgate node coupled to the first power supply rail.

5. The high voltage level shifter of claim 4, wherein the first N-type transistor of the second circuit portion includes a backgate node coupled to the first power supply rail.

6. The high voltage level shifter of claim 1, wherein the first P-type transistor of the first circuit portion includes a backgate node coupled to the fourth node.

7. The high voltage level shifter of claim 2, wherein the first P-type transistor of the second circuit portion includes a backgate node coupled to the fourth node.

8. The high voltage level shifter of claim 1, wherein the second P-type transistor of the first circuit portion includes a backgate node coupled to the second power supply rail.

9. The high voltage level shifter of claim 2, wherein the second P-type transistor of the second circuit portion includes a backgate node coupled to the second power supply rail.

10. The high voltage level-shifter of claim 1, wherein the first diode and the second diode of the first circuit portion are Zener diodes.

11. The high voltage level-shifter of claim 3, wherein the first diode and the second of the second circuit portion diode are Zener diodes.

12. The high voltage level shifter of claim 1, wherein the first N-type transistor, the first P-type transistor, and the second P-type transistor of the first circuit portion are metal oxide semiconductor field-effect transistors.

13. The high voltage level shifter of claim 2, wherein the first N-type transistor, the first P-type transistor, and the second P-type transistor of the second circuit portion are metal oxide semiconductor field-effect transistors.

14. A high voltage level shifter, the high voltage level shifter couples to receive an input signal to generate an output signal, comprising:

a resistor coupled between a first node and a first power supply rail;

an inverter coupled to receive the input signal to provide an inverted input signal;

a first N-type transistor coupled between a second node and the first power supply rail, the first N-type transistor biased by the inverted input signal;

a second N-type transistor coupled between a third node and the first power supply rail, the second N-type transistor biased by the input signal;

a first P-type transistor coupled between a fourth node and the second node, the first P-type transistor biased by the first node;

a second P-type transistor coupled between a fifth node and the third node, the second P-type transistor biased by the first node;

first and second diodes coupled in series between the first node and the fourth node;

third and fourth diodes coupled in series between the first node and the fifth node;

a third P-type transistor coupled between a second power supply rail and the fourth node, the third P-type transistor biased by the fifth node; and a fourth P-type transistor coupled between the second power supply rail and the fifth node, the forth P-type transistor biased by the fourth node, wherein the fourth node provide the output signal.

15. The high voltage level shifter of claim 14, wherein the first N-type transistor includes a backgate node coupled to the first power supply rail.

16. The high voltage level shifter of claim 14, wherein the second N-type transistor includes a backgate node coupled to the first power supply rail.

17. The high voltage level shifter of claim 14, wherein the first P-type transistor includes a backgate node coupled to the fourth node.

18. The high voltage level shifter of claim 14, wherein the second P-type transistor includes a backgate node coupled to the fifth node.

19. The high voltage level shifter of claim 14, wherein the first and second diodes are Zener diodes.

20. The high voltage level shifter of claim 14, wherein the third and fourth diodes are Zener diodes.

21. The high voltage level shifter of claim 14, wherein the third P-type transistor includes a backgate node coupled to the second power supply rail.

22. The high voltage level shifter of claim 14, wherein the fourth P-type transistor includes a backgate node coupled to the second power supply rail.

23. The high voltage level shifter of claim 14, wherein the first N-type transistor, the second N-type transistor, the first P-type transistor, the second P-type transistor, the third P-type transistor and the fourth P-type transistor are metal oxide semiconductor field-effect transistors.

* * * * *